United States Patent [19]

Saran et al.

[11] 4,376,933

[45] Mar. 15, 1983

[54] CIRCUIT FOR COMPACTING DATA

[75] Inventors: Amitabh Saran, Cypress; Guillermo F. Luzio, Huntington Beach, both of Calif.; Frank A. Betron, Plano, Tex.

[73] Assignee: Xerox Corporation, Stamford, Conn.

[21] Appl. No.: 152,969

[22] Filed: May 23, 1980

Related U.S. Application Data

[63] Continuation-in-part of Ser. No. 9,002, Feb. 23, 1979, abandoned.

[51] Int. Cl.³ .......................................... H03K 13/24
[52] U.S. Cl. ............................ 340/347 DD; 358/261; 364/900
[58] Field of Search .............. 340/347 DD; 358/260, 358/261; 364/711, 200, 900

[56] References Cited

U.S. PATENT DOCUMENTS

| | | | |
|---|---|---|---|
| 3,016,527 | 1/1962 | Gilbert | 340/347 DD |
| 3,310,626 | 3/1967 | Cassidy | 340/347 DD |
| 3,863,248 | 1/1975 | Deschenes | 340/347 DD |
| 3,875,344 | 4/1975 | Bogart | 340/347 DD |

OTHER PUBLICATIONS

Harrison "IBM Technical Disclosure Bulletin", vol. 5, No. 5, Oct. 1962, pp. 30-31.

*Primary Examiner*—C. D. Miller
*Attorney, Agent, or Firm*—Robert E. Cunha

[57] ABSTRACT

A circuit for compacting variable length data words into a fixed word length format is disclosed. Each variable length data word and its associated leading 0's are separated by a delimiter bit and stored in memory. When the memory is accessed, the output word is loaded in parallel into a first shift register and shifted to strip the leading 0's and delimiter bit. The remaining data bits are then shifted serially into a second shift register. When the second shift register is full, the resultant fixed length data word is latched out. When the first shift register is empty, the next word is loaded in from memory. In this way, a series of variable length words may be compacted into a series of fixed length words. This circuit is useful for compacting variable length Huffman codes since the boundaries between codes are self evident. This circuit can also be used as a character generator, where the variable length data output comprises the bits required to generate a character image on a raster scanned display.

13 Claims, 18 Drawing Figures

FIG. 1A
| RUN LENGTH | HUFFMAN CODE |
|---|---|
| 9 | 1 1 0 1 1 |
| 4 0 | 1 0 1 1 0 1 1 |
| 1 3 0 | 0 1 1 0 1 1 0 1 1 |
FIG. 1B
ROM # 1
| | | | | | | | |
|---|---|---|---|---|---|---|---|
| 9 | 0 | 0 | 0 | 0 | 0 | 0 | 0 |
| 40 | 0 | 0 | 0 | 0 | 0 | 0 | 0 |
| 130 | 0 | 0 | 0 | 0 | 0 | 0 | 0 |
ROM # 2
| | | | | | | |
|---|---|---|---|---|---|---|
| 0 | 0 | 0 | 0 | 0 | 0 | 0 |
| 0 | 0 | 0 | 0 | 0 | 0 | 0 |
| 0 | 0 | 0 | 0 | 0 | 1 | 0 |
ROM # 3
| | | | | | | |
|---|---|---|---|---|---|---|
| 0 | 0 | 1 | 1 | 0 | 1 | 1 |
| 1 | 1 | 0 | 1 | 1 | 0 | 1 |
| 1 | 1 | 0 | 1 | 1 | 0 | 1 |
FIG. 1C
8 BIT SHIFT REGISTER
FIG. 1D
FIG. 1E
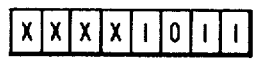
FIG. 1F
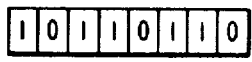
FIG. 1G

FIG. 3

006
CIRCUIT FOR COMPACTING DATA

BACKGROUND OF THE INVENTION

This is a continuation in part of a copending patent application, CIRCUIT FOR COMPACTING DATA, Ser. No. 9,002, filed Feb. 23, 1979 now abandoned.

This invention is a circuit which can be added to a fixed word length data handling system for compacting variable length data words into a fixed word length format.

It is frequently desirable in computer systems used for data transmission to pack variable length words into a fixed word length format. If this operation is accomplished using software, through the use of shifting and masking techniques, the amount of computer time spent on this operation will seriously degrade the overall system performance and is a significant factor in reducing the speed with which the computer can transmit or receive information.

U.S. Pat. No. 4,109,310, entitled Field Addressing System, describes a computer based system which uses microcode programming and specialized hardware to enable the writing or reading of variable length data in a fixed word length computer. The modes of operation in that patent and in the instant invention are different in that the prior field addressing system is capable of loading any variable sized word anywhere in memory while the instant invention is limited to the serial compacting of variable length words into a fixed word length format as they are received. However, the referenced patent does indicate, in its discussion of the microcode involved, the numerous steps required to shift and mask variable data words into a fixed word format, and to save residues, if any, for inclusion in the next shifting and masking step.

One method of reducing the amount of time required to transmit digital information is to encode the raw data through the use of run length coding. To use a numerical example, instead of transmitting thirty-two consecutive bits, the system would transmit the binary number 100 000, the binary number for thirty-two. Thus, thirty-two bits of information may be transmitted using a six bit word. Using run length encoding, a significant compression of data is possible.

Various improvements have been made on the basic technique of run length encoding. For example, in U.S. Pat. No. 3,560,639 entitled Cascade Run Length Encoding Technique, the basic run length coding is modified so that the run lengths most often encountered are assigned the shortest codes. In this way, a further compression over the basic run length coding compression is achievable. This referenced patent also describes a circuit comprising counters and shift registers for encoding and decoding the raw data into and out from this code.

A greater amount of data compression can be achieved through the use of Huffman codes. The advantages of using Huffman codes are:

(1) That the basic Huffman code may be modified to result in the greatest amount of compression based on the characteristics of the particular data being transmitted, and (2) that the codes may be transmitted serially at the transmitting end of the system with no additional data to indicate that boundaries between codes but are still uniquely decodable at the receiving end. A corresponding disadvantage of Huffman code is that there is no correlation between the number of bits in the raw data and the number of bits in the Huffman code, Huffman codes of varying length being abritrarily assigned to data words. Therefore, shifting and counting circuits such as those described in U.S. Pat. No. 3,560,639 are not suitable for the generation and interpretation of Huffman codes. What is required in high speed data transmission links, therefore, is a circuit which can be used to encode raw data into Huffman code form or to decode Huffman codes into raw data at high speeds. A particularly useful variation of this circuit would be one that could be added to a computer system which would be able to compact Huffman code data, or more generally, any sequence of variable length words into a fixed word length computer memory or equivalent, said circuit operating at high speeds and simultaneously requiring very little computer time to accomplish this function.

SUMMARY OF THE INVENTION

The data compactor circuit described herein has a variety of uses and can be most easily explained in terms of its use in a computer controlled facsimile system for the transmission of imaginal data. At the facsimile transmitter an image will be scanned and digitized and the resultant raw data will be run length encoded by any well known means. In this numerical example we will assume that a complete scan line comprises 1,024 bits so that each run length will be any number from 1 to 1,024. Further assume that these run lengths must be translated into Huffman codes of from three to twenty-three bits. Finally, these Huffman codes must be packed into fixed length words of eight bits per word for local storage prior to transmission to the facsimile receiver.

To accomplish this function at high speed and with a minimum amount of time required by the computer, a circuit comprising a read only memory containing two thousand words, each twenty-four bits wide, is required. This read only memory is programmed to contain all of the required Huffman codes and delimiter bits. These PROMS are in the address space of the processor memory so that, in this specific example, when the memory is addressed the corresponding Huffman code of up to twenty-three bits will be produced. In the general case, the output can be expanded to any length. These twenty-four bits will be loaded in parallel into a twenty-four bit shift register such that the valid Huffman code will be located in the least significant bits of the twenty-four bit register and the remainder of the twenty-four bit register will be loaded with leading 0's. To indicate to the remainder of the system the start of the valid Huffman code, a delimiting bit is placed between the leading 0's and the valid Huffman code to signify the beginning of the Huffman code word.

After the twenty-four bit shift register is loaded in parallel from the read only memory, the bits are shifted serially to a delimiter circuit which strips the leading 0's and the delimiter bit. Thereafter, as bits are shifted out of the twenty-four bit shift register they are allowed to serially load an eight bit shift register. Whenever the eight bit shift register is full, the resultant eight bit word may be shifted out in parallel to computer memory or any other buffer storage for subsequent transmission. Whenever the twenty-four bit shift register becomes empty, a new run length code may be used to address the ROM to produce the next Huffman code which is again loaded in parallel into the twenty-four bit shift register. In this way, the entire process of formatting the Huffman codes which vary in this numerical example, from three to twenty-three bits, into fixed length words of eight bits is accomplished at high speed and with little overhead.

The same circuit may also be used for the decompression of data. In this case the Huffman code is used to generate a PROM address, and the output of the PROM is a string of video bits.

For long run lengths, one PROM location may have to be addressed repeatedly to generate the required number of video bits. As a numerical example, if 100 bits are to be generated, a location containing 23 bits may be addressed four times and a location containing 8 bits then addressed once. The processor software is used to control this process.

If the eight bit shift register output must be loaded into a computer memory, an existing computer I/O port could be used for this purpose. However, for higher speed applications, a direct memory access (DMA) channel would be used.

The identical circuit, comprising a read only memory, a twenty-four bit shift register, a delimiter for stripping leading 0's and delimiter bits, and an eight bit shift register for outputting the fixed length word, could also be used as a character generator. In this application the read only memory could be used to store an entire font where each alphanumeric character is typically defined by a twenty by twenty-two bit matrix. In this case eleven bits of information could be used to specify the particular alphanumeric character and the line of that character, the selected line of twenty-two bits being loaded into a twenty-two bit register in parallel. Thereafter, this information is serially shifted into an eight bit shift register, as above, for temporary storage and for ultimate use as a means of generating character images through the use of any raster output scanning device.

In either case, by using a read only memory, a large shift register for receiving the ROM contents in parallel and a smaller shift register for collecting words of the fixed length required for the particular computer, variable length data may be compacted into fixed length words for use in a fixed word length system. In both cases the circuit components can be varied so that read only memory output words and fixed length words of any size may be accommodated.

It is thus an object of this invention to provide a circuit for the high speed conversion of fixed length words to variable length words and to compact these variable length words into a fixed length format.

BRIEF DESCRIPTION OF DRAWINGS

FIG. 1A is a hypothetical set of decimal run lengths and corresponding Huffman codes.

FIG. 1B shows the arrangement of these codes in ROM.

FIGS. 1C through 1G shows the process for compacting these codes into 8 bit output words and remainders.

FIG. 3 shows the arrangement of ROM data when used as a font generator.

DETAILED DESCRIPTION OF THE INVENTION

Figure 2A:
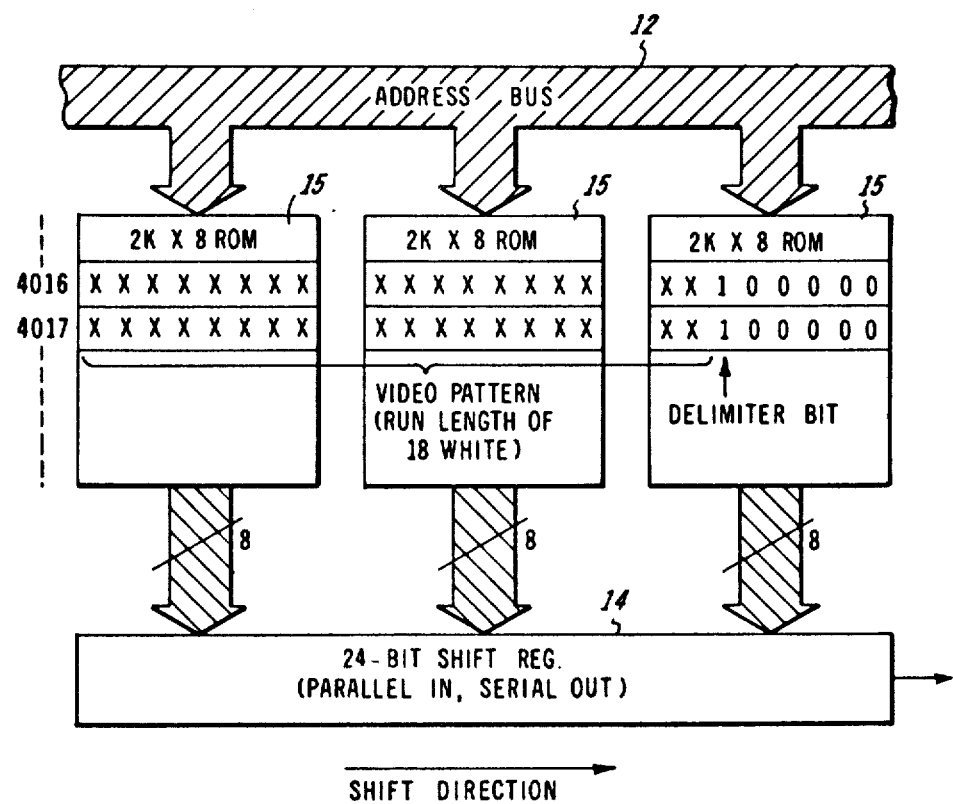
FIG. 2A is a simplified schematic of the ROM and 24 bit shift register.

The disclosed embodiment stores Huffman codes, of from three to twenty-three bits in length, in a ROM comprising three devices, each with a capacity of 1,024 words by eight bits. In fact, the codes used in the preferred embodiment are not pure Huffman codes but the differences are not significant in relation to the apparatus and methods described herein. Assuming, for purposes of discussion, that the Huffman equivalents of the decimal runs lengths 9, 40 and 130 are as shown in FIG. 1A, and are stored in ROM as shown in FIG. 1B, then the circuit would operate functionally as follows:

The ROM would first be addressed by a relative address corresponding to the Huffman code of the run length, resulting in twenty-four bits being shifted in parallel into a shift register. Next, this word would be shifted serially out to a delimiter circuit which would strip the leading 0's and the delimiter bit. If the first word accessed was the Huffman code equivalent of the decimal number 9, after stripping, the remainder would be 11011, as shown. This would be shifted serially into the first five bits of an eight bit shift register as shown in FIG. 1C.

The next number is then accessed from ROM. In this case we will assume the decimal number 40. After stripping, the binary number 1011011 will be shifted into the 8 bit shift register. In this case, after the first three bits are shifted in, the 8 bit shift register is full, and the word contained therein may be transferred out in parallel to buffer memory, as shown in FIG. 1D.

The remaining bits are then shifted into the 8 bit register, resulting in the bit pattern of FIG. 1E.

The third code word corresponding to the decimal number 130 is next processed, the first 4 bits resulting in a second output word as in FIG. 1F and a remainder as shown in FIG. 1G. In this way, variable length words are compacted into fixed word segments.

FIG. 2A is a block diagram of the address bus, ROM and twenty-four bit shift register. An eleven bit address is received by ROM devices 15 in parallel and a twenty-four bit parallel output is applied to the twenty-four bit shift register 14. The direction of shift can be either direction, in FIG. 2A the bits are shifted to the right in the twenty-four bit shift register 14. As shown, each word consists of leading 0's, a delimiter 1 bit, and the pattern which could comprise any combination of 1's and 0's, here indicated with X's. The contents of ROM 15 could be either a video pattern, as shown, to be used in a character generator mode or could be Huffman codes or equivalent to be used as described above.

Figure 2B:
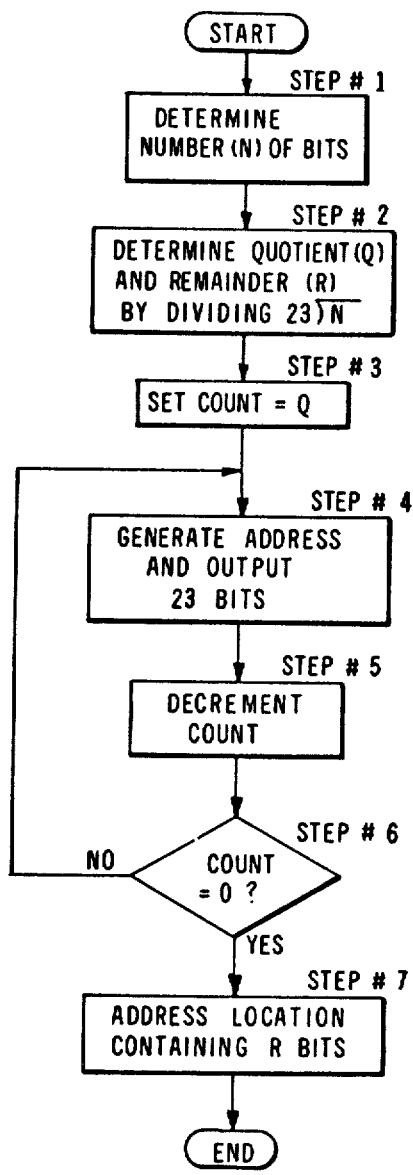
FIG. 2B is a flow chart of a decompression subroutine for producing run lengths in excess of the memory word length.
Figure 2C:
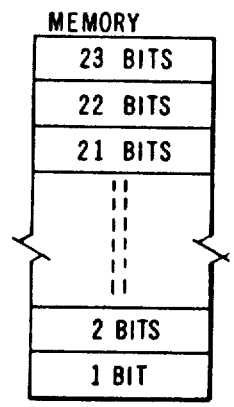
FIG. 2C is a portion of PROM used in conjunction with said subroutine of FIG. 2B.

In the event that a run length longer than twenty-three bits must be produced, a twenty-four word section of PROM memory, as shown in FIG. 2C, and a processor program, as shown in FIG. 2B, may be used in conjunction with this circuit. First, the program divides the number of bits in the desired run length by the maximum number of bits which can be contained in one PROM location. For a numerical example, assume that the run length is 100 (N=100), and the maximum number of bits per memory location is 23. Then the quotient will be 4 (Q=4) and the remainder will be 8 (R=8). The processor will then loop through steps #4, #5, and #6 four times to produce 92 bits, and finally, fall through step #7 to add the last 8 bits. Using this decompression technique, run lengths in excess of the memory word length may be produced.

The indicated addresses of the two accessed words in FIG. 2A are 4016 and 4017, octal. These would be typical addresses in a computer with a 2K main memory and where the 4XXX address block is reserved for this data compaction circuit ROM.

Figure 3:
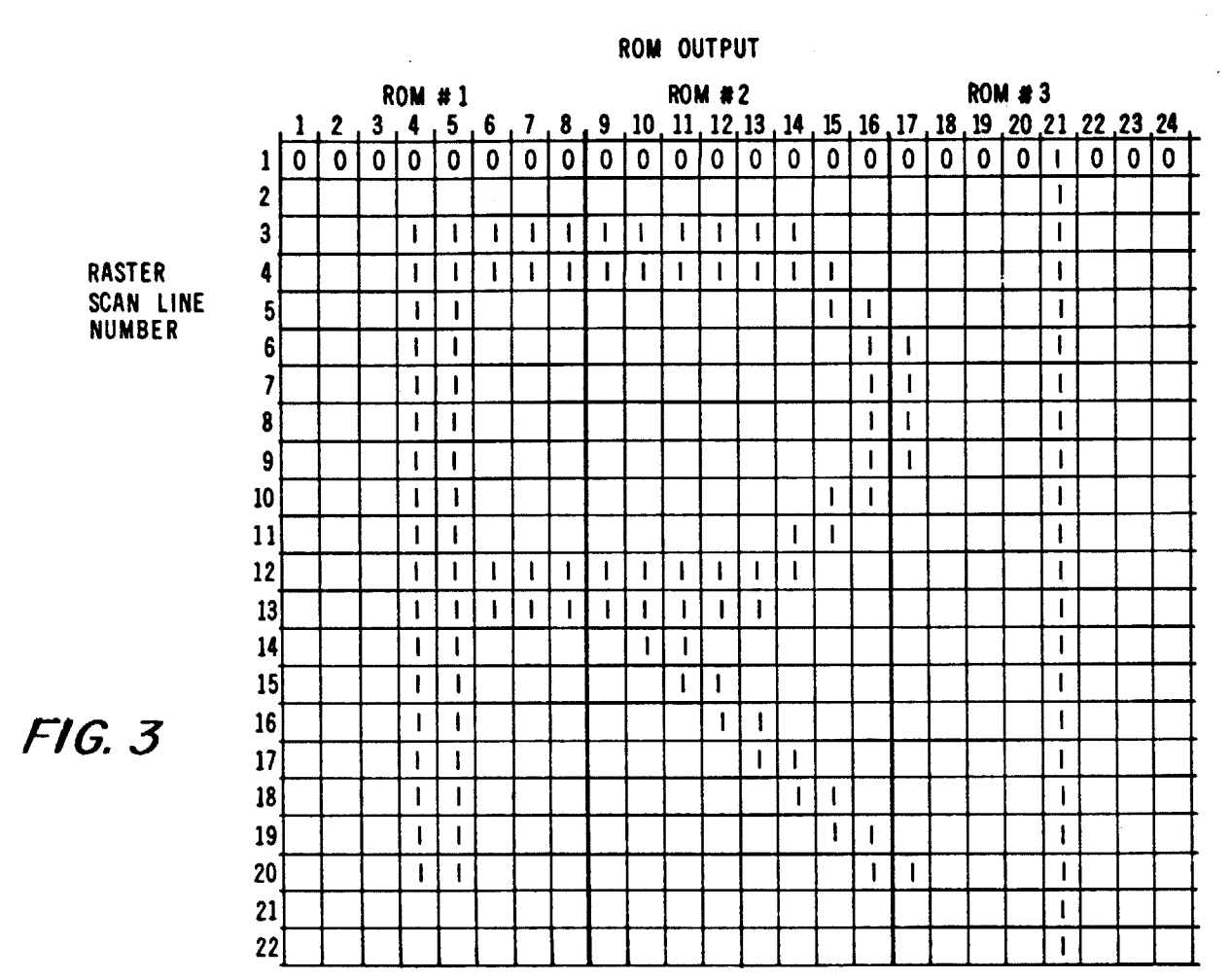

FIG. 3 shows the typical contents of a ROM when a circuit is used in its character generation mode. At the system level, the appropriate character identifier and the raster scan line number are used as address components. The addressed line of data is then loaded into the twenty-four bit shift register as before.

For the letter "R", bit 21 is the delimiter bit, leaving twenty bits to be output as character data. For a narrower letter, the delimiter bit could occupy a position further to the left and the character centered in the remaining space to create variable width letter spacing. In this figure, all empty bit positions should be 0, but except for the first row, these bits were omitted for greater clarity.

Figure 4:
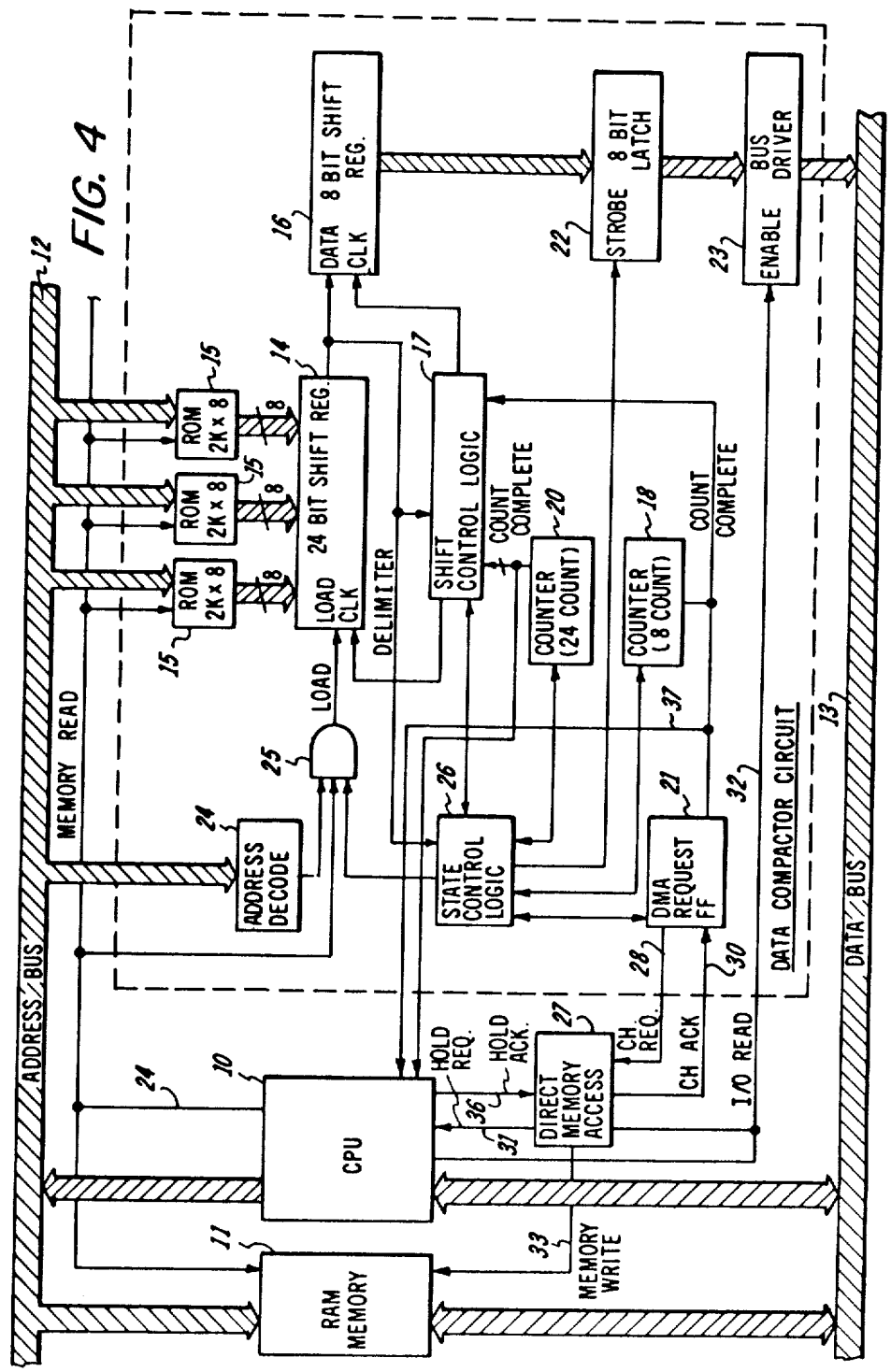
FIG. 4 is a block diagram of the system including CPU, main memory, DMA channel and data compacting circuit.

The overall block diagram of this system is shown in FIG. 4. The CPU 10 and memory 11 can be connected in any well known configuration. Here the CPU 10 drives the address bus 12 and both CPU 10 and memory 11 communicate bidirectionally with the data bus 13. A discrete memory read line 24 is also provided to enable main memory 11 or ROM 15 read out.

When ROM 15 is addressed, twenty-four bits of data are loaded in parallel into the twenty-four bit register 14. Next, under control of the shift control logic 17, this twenty-four bit data word is shifted right until all leading 0's and the delimiter bit are stripped. Then, the valid data bits are serially shifted into the eight bit shift register 16.

Each clock pulse used to shift the twenty-four bit shift register 14 data is counted by the counter 20. When the twenty-four bit shift register is empty, a "count complete" signal is coupled from the counter 20 to the shift control logic 17 as shown, and also to the CPU 10. The CPU 10 will then address another ROM data word to begin a new cycle.

Each clock pulse used to shift the eight bit shift register 16 is counted by the counter 18. When the counter 18 is full, a "count complete" signal is coupled from the counter 18 to the shift control logic 17, the state control logic 26, the latch 22 and the DMA request Flip Flop 21. As a result, the eight bit shift register 16 data word is immediately latched into the eight bit latch 22, freeing the eight bit shift register 16 to begin compacting the next word. The 8 bit data word in the latch can then wait for the DMA 27 to steal a memory cycle, during which the eight bit word will be loaded from latch 22 into memory 11 through the bus driver 23 and the data bus 13.

During any memory read cycle, the memory read line 24 enables both main memory 11 and ROM 15. However, the twenty-four bit shift register 14 will load the data presented to it only if a ROM address is specified by the CPU 10. This decision is made by the address decode logic 24, the output of which allows a load signal from the state control logic 26 to pass through gate 25.

The compacted data may be loaded into a buffer register or into a CPU through any standard I/O port or DMA channel. In this described embodiment, the loading is accomplished through the use of a direct memory access circuit 27. When the DMA request flip flop 21 receives an indication originating from the counter 18 that an 8 bit word is ready for storage, it issues a channel request on line 28 to the DMA access circuit 27, which returns a channel acknowledge signal on line 30, resetting the DMA request flip flop 21. Simultaneously, the DMA 27 sends a hold request signal on line 31 to the CPU, requesting the CPU 10 to release the memory 11 long enough for a load cycle. When a hold acknowledge signal is received from the CPU 10 on line 36 by the DMA 27, a I/O read command is issued on line 32 to the bus driver 23. A memory write command is also issued to the memory 11 on line 33, thus enabling the bus driver 23 to load one word from the latch 22 through the data bus 13 into memory 11.

As an alternative, the I/O port could be used to load the memory. In this case when the count complete signal is received by the CPU 10 on line 37, the CPU will transmit an I/O read signal on line 32 to enable the bus driver 23 to drive the data bus. An ordinary memory read cycle will then load the data into memory 11.

Figure 5:
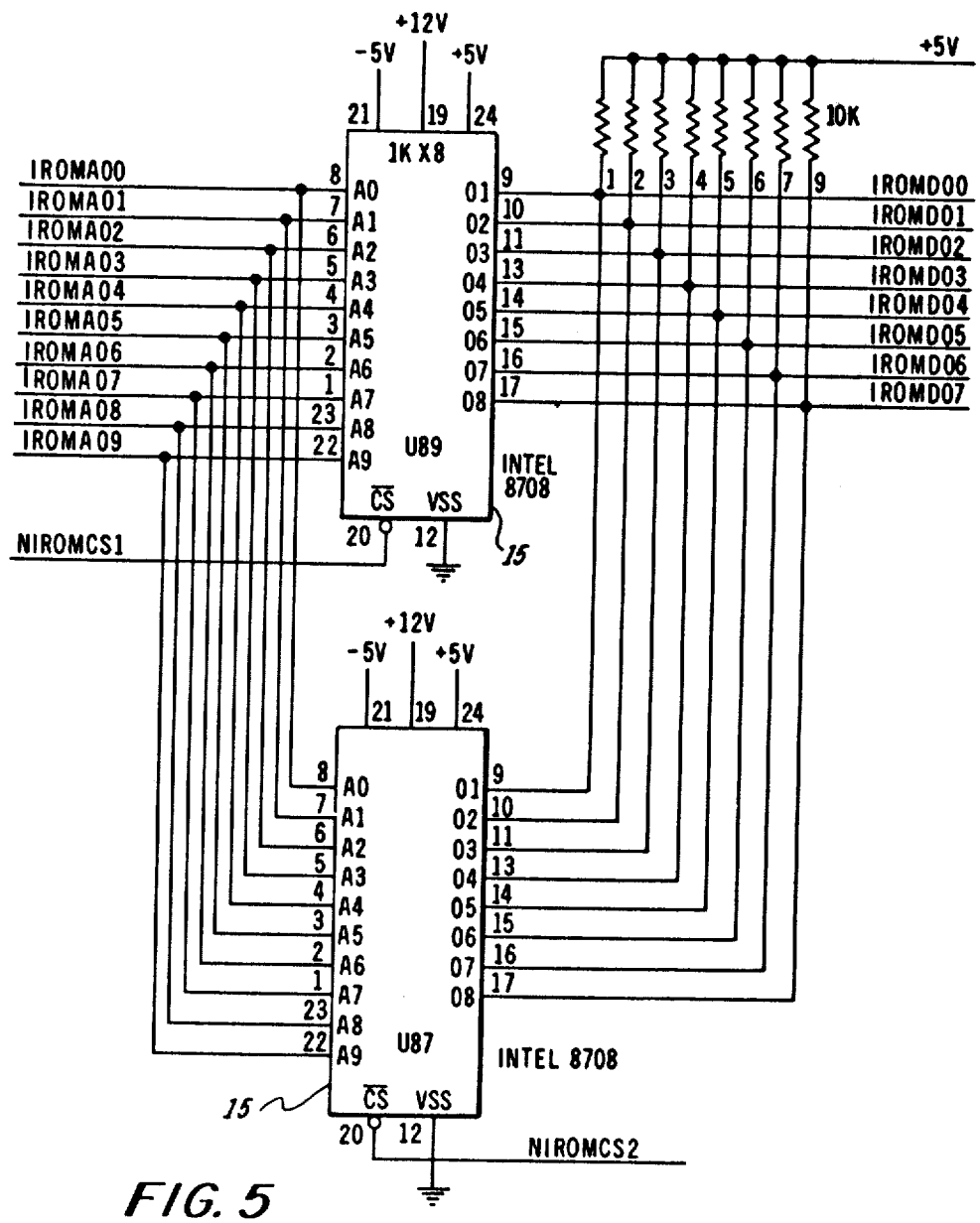
FIG. 5 is a schematic diagram of the ROM.

FIG. 5 is a detailed schematic diagram of the ROM 15. Only one read-only memory 15 of the three required is shown since all are identical. Each is a 2K × 8 memory implemented from two Intel 8708 devices. The address lines IR0MA00-09 are driven by the CPU 10, in this case an Intel 8080 device, and the data is output on lines IR0MD 00-07.

To initialize the system, and to start the process, the computer 10 must address the ROM 15 to output a first word to the twenty-four bit shift register 14, shown as three register devices U126, U127, and U128. In order that this circuit may identify requests to the ROM 15 as opposed to a request to some other memory, an address decode section 24 comprising gates U44 and U134 is provided. These gates monitor the memory read signal NMEMREAD - TS, a decoded high (address location) memory signal IHMEM, a ROM address bit IROM A11, and a data bus input signal NDBIN-TS to produce a high input at the 1CO input of multiplexer U137. At the moment the state counter U135 is zeroed so that the ICO input of multiplexer U137 is selected as an output to the C input of decoder U136. This constitutes a "100" input to the decoder which outputs a low signal at its Y4 output, which in turn enables the loading of the twenty-four bit shift register 14 from the ROM and also sets counter 20 to a count of twenty-four. The output of multiplexer U137 also enables the state counter U135 to a count of one so that multiplexer U137 now begins to monitor its 1C1 input line.

The actions described above are shown in FIG. 6 in state diagram form as "STATE O". That is, when the ROM is addressed and when a memory read and a data bus enable signal are received the counter will be preset to a count of twenty-four and the ROM data will be loaded into the twenty-four bit shift register.

Figure 6:
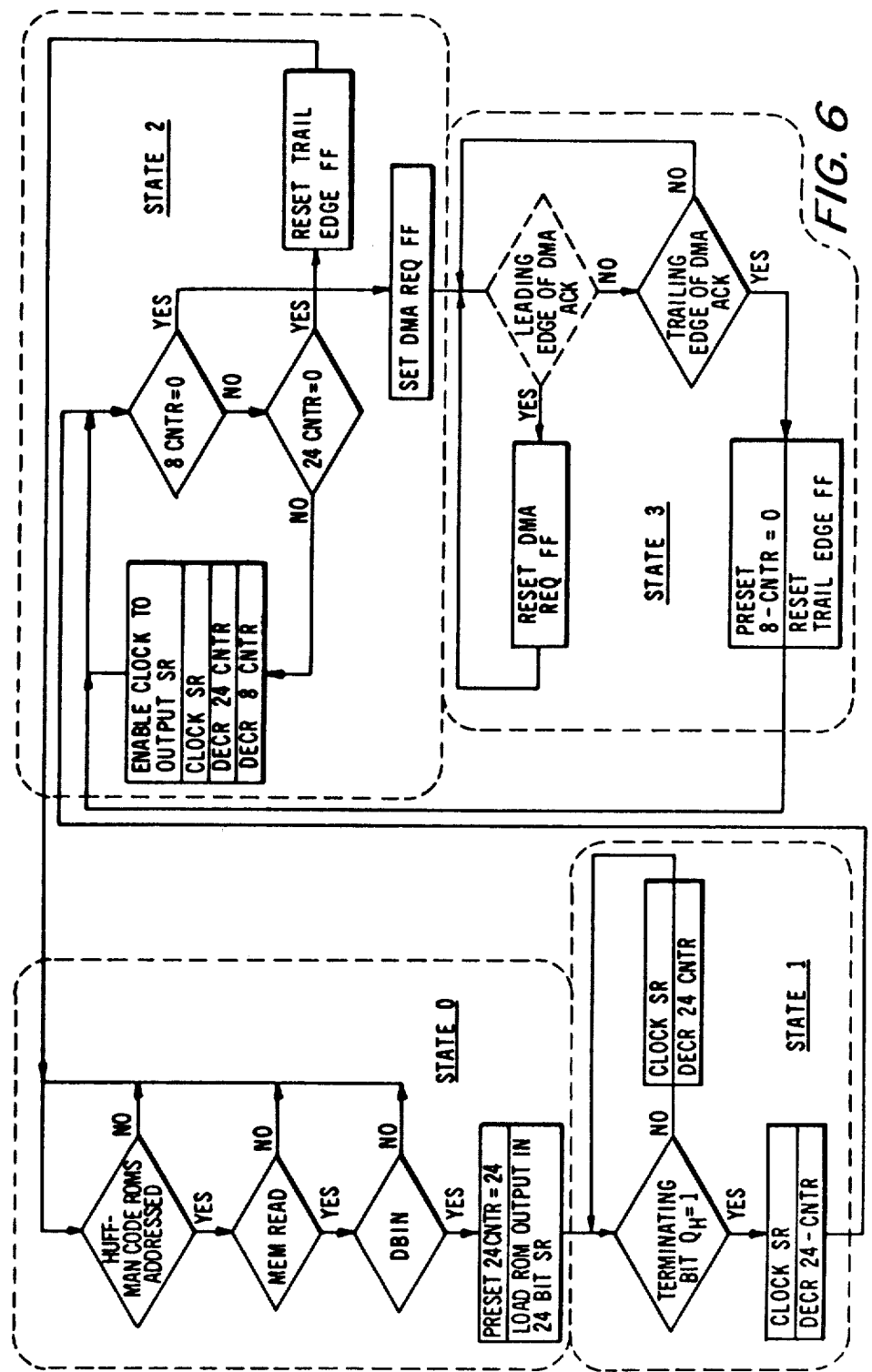
FIG. 6 is a state diagram of the circuit operation.
Figure 7A:
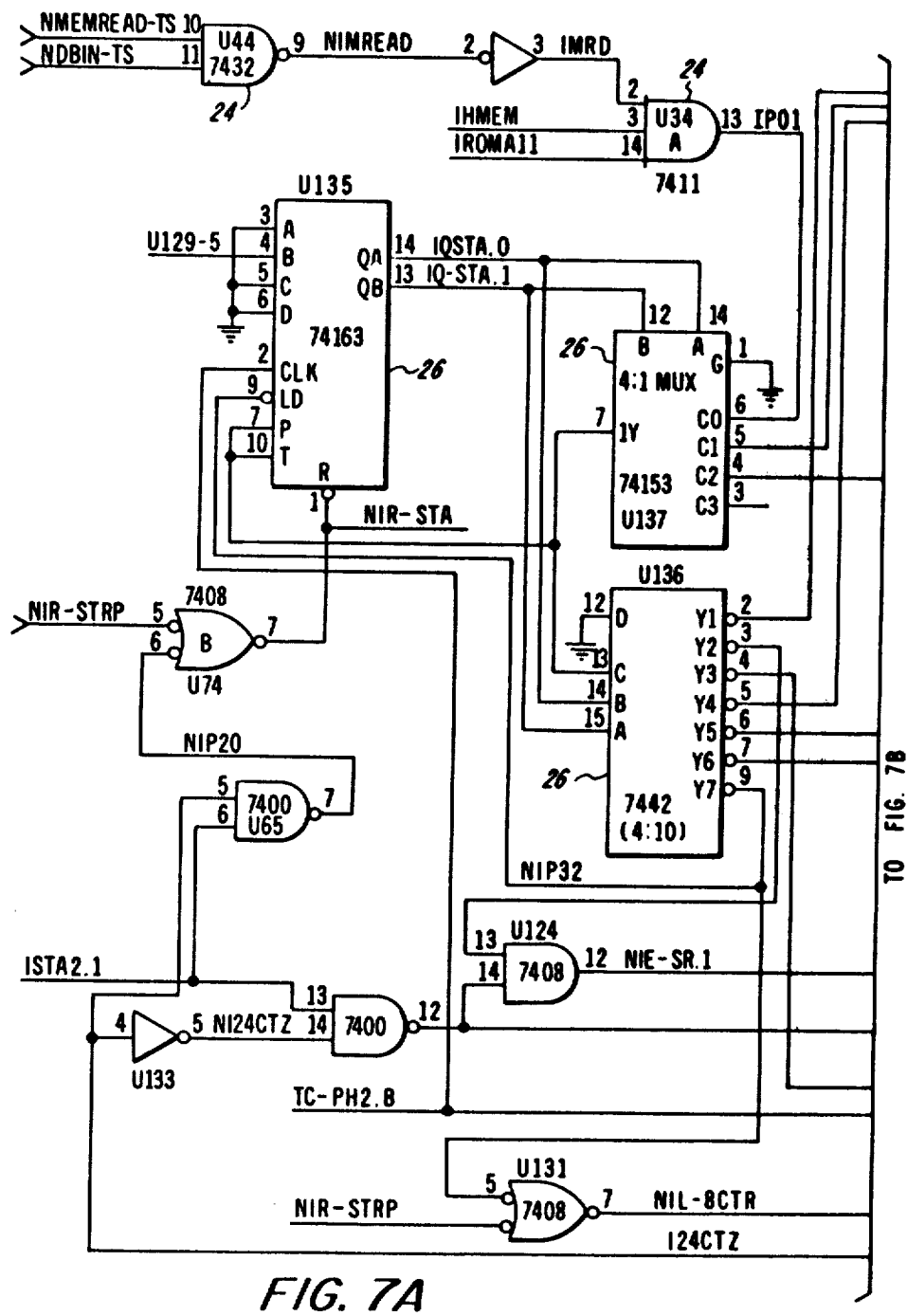
FIGS. 7A–7D are schematic diagrams of the circuit.
Figure 7B:
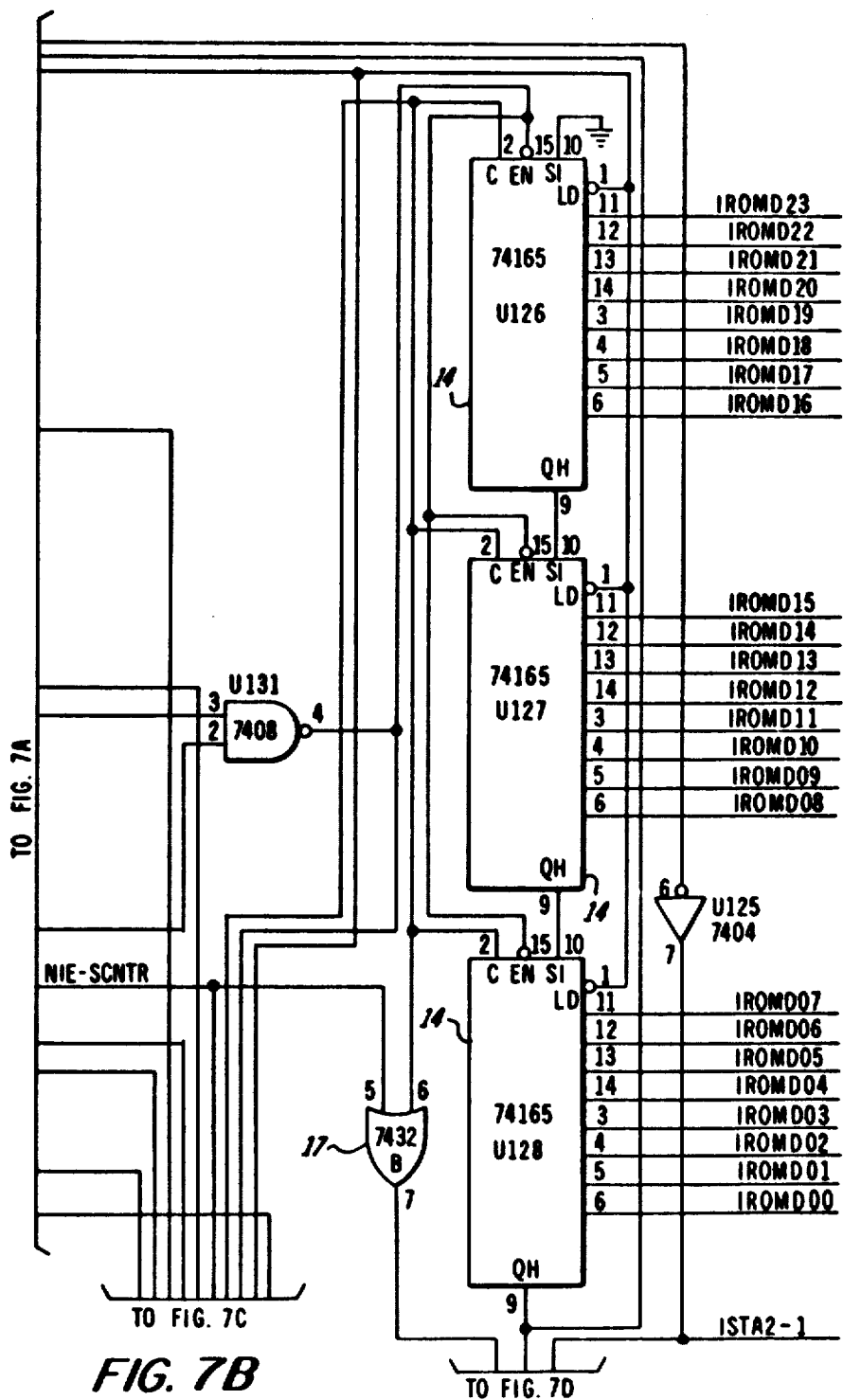
Figure 7C:
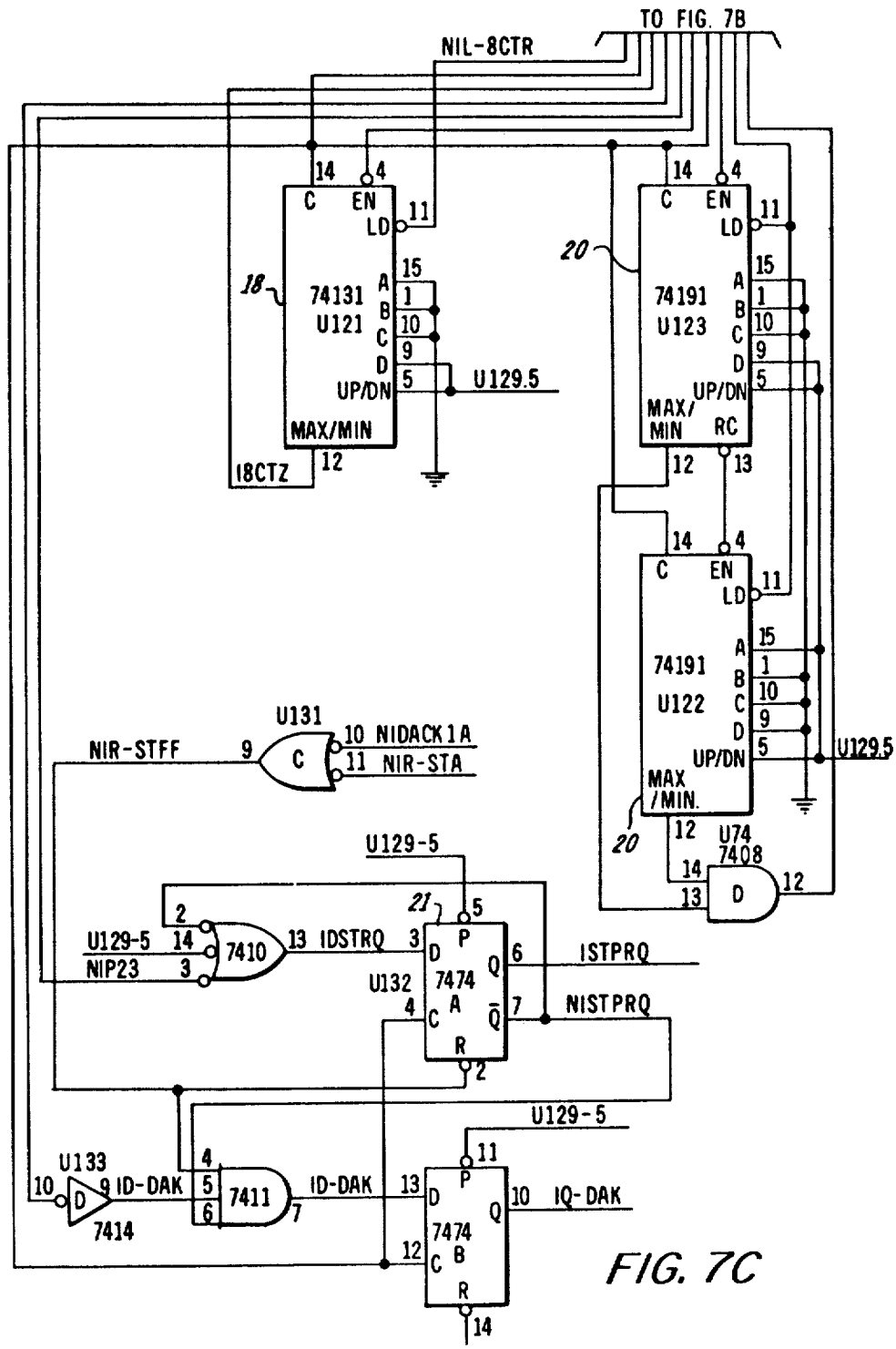
Figure 7D:
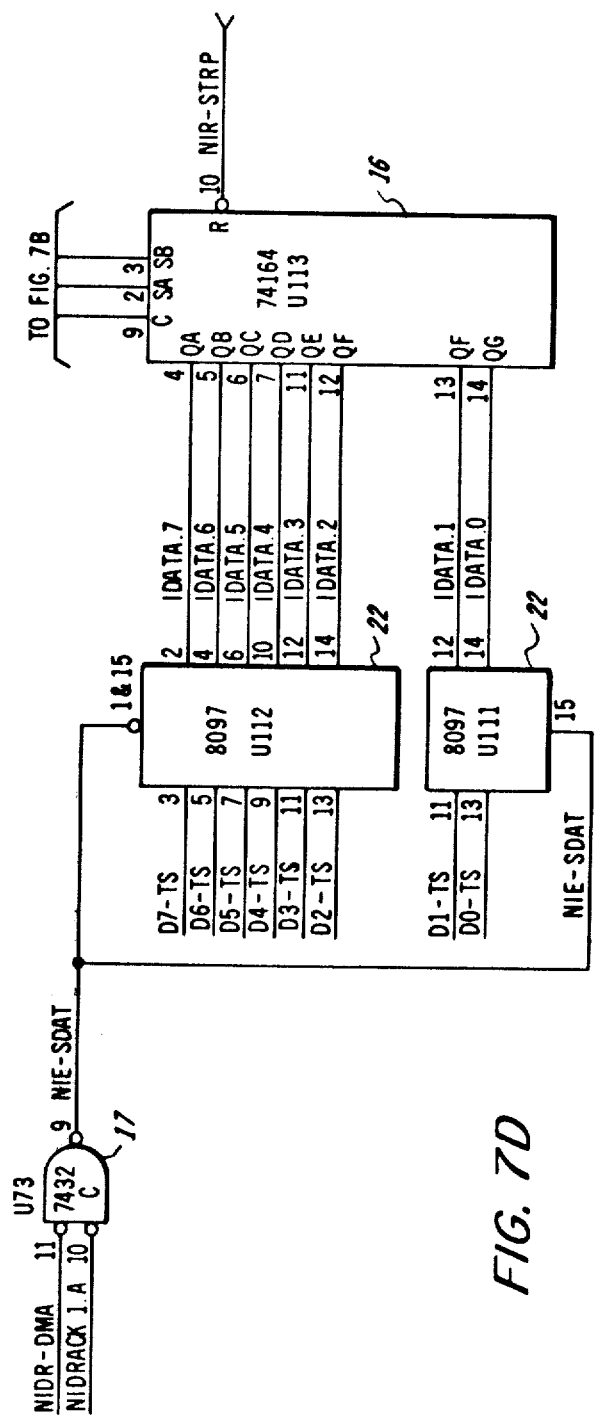

In the next state, STATE 1 of FIG. 6, the last bit of data in the twenty-four bit shift register is inspected. If it is not a one (terminating) bit, the twenty-four bit shift register data is shifted, the twenty-four counter is decremented, and the next bit is inspected. If the inspected bit is a terminating bit, the shift register is shifted one more bit to strip the terminating bit, the twenty-four counter is decremented and the circuit falls through to the next state.

These STATE 1 functions are implemented in the hardware of FIG. 7 as follows. The counter U135 output at this time is "01" and the serial output bit from shift register U128, coupled through the 1C1 line of the multiplexer U137 to the C input of decoder U136 is a leading zero. This presents to the decoder U136 a "010" input pattern, enabling the Y2 output line. This output is coupled through gates U124 and U131 to enable the twenty-four bit shift register 14 to shift and the counter 20 to count on every clock.

When a terminating one bit is present at the output of register U128, it is coupled through the multiplexer U137 to the C input of the decoder, resulting in a "110" input and a Y6 output at decoder U136. This enables the shift registers 14 and counter 20, through gate U131 to shift out the terminating bit and decrement. At the same time multiplexer U137's output is applied to the counter U135, so that it increments to the next state. At this time, the leading zeros and terminating bit have been stripped and valid data remains in the twenty-four bit shift registers 14.

STATE 2 of FIG. 6 shows an inspection of the eight counter 18 and twenty-four counter 20. If neither is zero, one bit of data of the twenty-four bit shift register 14 is shifted into eight bit shift register 16, and both counters are decremented. If the twenty-four counter goes to zero, STATE O is entered to load another word from ROM. and when the eight counter becomes zero, STATE 3, is entered where the eight bit word is output. If not, the shifting continues until eight bits are shifted into shift register 16. This is indicated by the eight counter going to zero.

The FIG. 7 hardware operates in STATE 2 as follows. The state counter U135 outputs a "10" to the decoder U136, and multiplexer U137 is monitoring its 1C2 input which originally is at a zero state. Thus, decoder U136 sees a "001" input, activating the Y1 line and gate 125. This enables the eight bit shift register 16, and through gates U62, U124 and U131, the twenty-four bit shift register U1261, U127, U128, twenty-four counter 20, and eight counter 18. In this state, the clocks will run freely and data will be shifted from register 14 to register 16 until either counter reaches zero.

When the twenty-four counter 20 goes to zero, its zero output is coupled from pin 12 of U74D through gates U65, and U74B to the reset of state counter U135, zeroing it, and resetting the system to STATE O, where a new word will be loaded from ROM 15.

If the counter 18 goes to zero first, the output at pin 12 will be coupled through the 1C2 input of multiplexer U137 to the state counter U135 to increment it.

As shown in FIG. 6, when STATE 3 is entered, the DMA request flip-flop is set, indicating to the CPU 10 that an eight bit output word is available at the data bus. When that word is loaded into memory 11, an acknowledge signal is received which resets the eight bit counter and returns the circuit to STATE 2.

In the circuit of FIG. 7, at the moment when the eight counter 18 goes to a count of zero, the state counter U135 will still be at a count of two. These combine to activate the Y5 output line of decoder U136. This sets the DMA flip-flop 21 which sends a discrete signal to the counter 10 signifying that a word is ready to be loaded into memory 11. At the same time, gate U73C will enable latch 22 to accept the eight bits from register 16.

After the DMA channel of the processor reads this word, it transmits an acknowledge signal through gate U131C which resets the DMA flip-flop U129-5, sets the acknowledge flip-flop U132B, and applies a high input to the 1C3 input of multiplexer U137, resulting in the activation of the Y7 output line of decoder U136. This line reloads the eight counter 18 with a count of eight, and sets the state counter U135 back to a state of two. It also enables the output of latch 22 to be enabled onto the processor bus D0-TS through D7-TS.

This circuit has been described in terms of using a ROM for storage of fonts, data bit run lengths and Huffman codes. However, it is obvious that volatile RAM may also be used. In this case, the coding may be changed to increase efficiency when a different mode of operation is entered (half tone images to text, for instance). Similarly, a change of font could be accomplished by loading a different data set into the character generator. This description is based on an example where the ROM word length is longer than the fixed word length. This is not a necessary limitation, short variable words may be compacted into longer fixed length words with this data compaction circuit. Also, codes other than Huffman codes may also be used in the compression and decompression modes described herein.

The invention is not limited to any of the embodiments described above, but all changes and modifications thereof not constituting departures from the spirit and scope of the invention are intended to be covered by the following claims.

What is claimed is:

1. A circuit for compacting variable length data into a fixed word length format comprising:
  an m bit per word memory for storing and outputting variable length data words, said m bits comprising a variable length data word, unused bits and a delimiter bit to mark the boundary between said data word and said unused bits,
  an m bit shift register for serially receiving the contents of said m bit shift register,
  an n bit shift register for serially receiving the contents of said m bit shift register,
  means for preventing the loading of said unused bits and said delimiter bit into said n bit shift register as said bits are shifted out of said m bit register,
  a counter responsive to the count of bits remaining in said m bit shift register for enabling said memory to load an m bit next word into said m bit shift register after the previous m bit register contents have been completely shifted out, and
  a counter responsive to the count of bits loaded into said n bit register for enabling said n bit register to output its contents in parallel after serially receiving n bits of data.

2. The apparatus of claim 1 wherein said m bit per word memory is read only memory.

3. The apparatus of claim 1 further comprising an n bit processor and associated memory into which said n bit words are to be loaded, and
  a DMA channel for storing the n bit shift register output into said n bit memory.

4. The apparatus of claim 1 further comprising, an n bit processor and associated memory into which said n bit words are to be loaded and
  an I/O port for storing the n bit shift register output into said n bit memory.

5. The apparatus of claim 1 further comprising a buffer memory for temporarily storing said n bit word output from said n bit shift register.

6. The apparatus of claim 1 wherein said m bit per word memory is volatile RAM.

7. The apparatus of claim 1 wherein said variable length data are codes corresponding to input run length data and further comprising means for generating an address of the location in said m bit per word memory in which is located the code corresponding to said run length, and for addressing said m bit per word memory with said address.

8. The apparatus of claim 1 wherein said variable length data are data bit runs of variable lengths and further comprising means for generating an address of the location in said m bit per word memory in which is located the data bit run corresponding to a run length code received by said apparatus, and for addressing said m bit per word memory with said address.

9. The apparatus of claim 8 further comprising:
a processor and associated memory and
a subroutine in said memory adapted to be executed by said processor for iteratively accessing one or a plurality of m bits per word memory locations so that an output data bit run exceeding m bits may be output.

10. The apparatus of claim 8 wherein the address generated is a function of a raster scan line number and a character code and wherein said data bit runs of variable length are the corresponding video required to generate the character.

11. In a facsimile transmitter, a circuit for converting run length code into variable length code and for compacting said variable length code into n bit fixed length words, comprising:
a memory in which variable length codes, unused bits and delimiter bits are stored, said memory arranged so that when an address which is a function of a run length is received, the associated variable length code will be produced,
a first shift register adapted to receive the output bits from said memory in parallel,
means for stripping said unused bits and delimiter bit from said first register,
a second shift register adapted to receive the variable length code bits serially from said first shift register,
means for enabling said second shift register to output its contents in parallel when said second shift register is full, and
means for generating a next address for said memory when said first shift register becomes empty.

12. The apparatus of claim 11 wherein said memory is a read-only memory and said means for generating is a processor.

13. The apparatus of claim 12 further comprising a buffer register for storing the output of said second shift register.

* * * * *